US006429575B1

(12) United States Patent
Abramov et al.

(10) Patent No.: US 6,429,575 B1
(45) Date of Patent: Aug. 6, 2002

(54) DEVICE FOR TRANSMITTING ULTRASONIC ENERGY TO A LIQUID OR PASTY MEDIUM

(75) Inventors: Vladimir Abramov, Moscow; Oleg Abramov, Moskau, both of (RU)

(73) Assignee: Tech Sonic Gesellschaft fur Ultraschall-Technologie m.b.H. (DE)

( * ) Notice: Subject to any disclaimer, the term of this patent is extended or adjusted under 35 U.S.C. 154(b) by 0 days.

(21) Appl. No.: 09/403,850

(22) PCT Filed: Apr. 23, 1998

(86) PCT No.: PCT/EP98/02404

§ 371 (c)(1),
(2), (4) Date: Dec. 21, 1999

(87) PCT Pub. No.: WO98/47632

PCT Pub. Date: Oct. 29, 1998

(30) Foreign Application Priority Data

Apr. 24, 1997 (DE) ........................................ 197 17 397

(51) Int. Cl.$^{7}$ ................................................ H01L 41/04

(52) U.S. Cl. ...................................................... 310/337

(58) Field of Search ................................. 310/334, 337

(56) References Cited

U.S. PATENT DOCUMENTS 4,016,436 A * 4/1977 Shoh .......................... 310/322
4,537,511 A * 8/1985 Frei .......................... 366/127
5,994,818 A * 11/1999 Abramov et al. ........... 310/325

* cited by examiner

*Primary Examiner*—Nestor Ramirez
*Assistant Examiner*—Peter Medley
(74) *Attorney, Agent, or Firm*—Pendorf & Cutliff

(57) ABSTRACT

A device for transmitting ultrasonic energy to a liquid or pasty medium, comprising an alternating current generator (23) intended to operate in a frequency range of 1 to 100 kHz, a magnetostrictive or piezoelectric transceiver (12) capable of producing under the generator output AC voltage longitudinal high frequency mechanical vibrations, a waveguide (27) in the form of a cylindrical rod capable of being stimulated by said transceiver for generating longitudinal harmonic vibrations, and a cavity resonator (17) acoustically coupled with the waveguide and in a tubular form for converting said longitudinal harmonic vibrations into transversal vibrations relative to the longitudinal axis (14), the wave power of which can be injected into the medium to be submitted to sonicating. Said cavity resonator (11) is designed in such a way the resonance requirement is met both for the longitudinal and transversal self-vibrations of its envelope (18).

15 Claims, 4 Drawing Sheets

DEVICE FOR TRANSMITTING ULTRASONIC ENERGY TO A LIQUID OR PASTY MEDIUM

BACKGROUND OF THE INVENTION

1. Field of the Invention

The invention concerns a device for transmitting ultrasonic energy to a liquid or pasty medium. A device of this type is the subject matter of a co-owned, not published patent application (DE 195 39 195 A1).

2. Description of the Related Act

In the known devices in this technology (U.S. Pat. No. 4,016,436) there is provided on one side of a tubular shaped hollow chamber resonator a waveguide, which by means of a piezoelectric transducer, which for its part converts electrical alternating current voltage (a.c. voltage, hereafter alternating current) output signals of an alternating current generator into longitudinal mechanical oscillations, is excitable to resonant longitudinal oscillations. Onto this transducer, a hollow chamber resonator is mechanically rigidly acoustically coupled in a flange-shaped area of the transducer.

In a further device of similar type (U.S. Pat. No. 5,200, 666), ultrasonic energy is transmitted on both ends of the tubular shaped resonator, which is provided for conversion of longitudinal oscillations into transverse oscillations, by means of respectively one transducer.

It is also known (U.S. Pat. No. 4,537,511) to employ a tubular shaped hollow chamber resonator, which is closed on both ends and from one side is acted upon by ultrasound transmitted by a transducer.

In all of these devices, the length of the hollow chamber resonator is selected similarly in a first approximation according to the equation $$L=nc_0/2f_r \qquad (A)$$

in which n represents a whole number, $c_0$ represents the sound velocity in the rod shaped resonator, and $f_r$ represents the mechanical resonance frequency of the waveguide employed for introduction of ultrasound into the resonator and acoustically coupled with a transducer. The sound velocity $c_0$, is provided by the equation $$c_0=\sqrt{E/\rho} \qquad (B)$$

in which E represents the modulus of elasticity (Young's Modulus) and ρ represents the specific weight of the resonator material.

In so far as sub-optimal results are achieved by the selection of the resonator length according to the first mentioned equation (A), it is conventional to use experimental attempts to determine the correction of the resonator length, which process, however, is only rational or justifiable, when subsequently a larger number of such devices are to be constructed with this optimized length as determined by experimental attempts. Special devices, which are only constructed in small quantities, are thus very expensive. In addition to this, it may occur that during such a process the result is often times relatively far from the theoretical optimum, which is however taken into consideration, since the device can be suitably produced for the intended purpose by employment of a high output frequency generator and transducer. However, these devices are expensive as a result of the necessity of over-dimensioning their electronic supply and transducer.

SUMMARY OF THE INVENTION

It is thus the object of this invention, to provide a design for the above-mentioned device, which produces an economically high transmission efficiency and, after which it has once been designed, there is no, or at least no significant, requirement for follow-up processing in order to arrive at dimensions for an operation with optimal working efficiency, in particular, a device having a pre-determined design which operates with a working efficiency which is close to the optimal working efficiency.

The deviation of the resonator length from the relation (A) could be relatively small, so that the inventive arrangement with respect to the equation (A) produces only a correspondingly minimal improvement, but it could however in practical cases also deviate by almost 40% from the result obtainable by the equation (A), so that, compared with such a case, the inventive design or arrangement provides a substantially improved result.

Also, for the closed design of the hollow chamber resonator, by the inventive arrangement of its length L, its outer diameter D, and its wall thickness a very precise tuning to the resonance requirements can be achieved. In the closed configuration of the hollow chamber resonator, this can be flushed with a liquid cooling medium and can be advantageously employed in this case for ultrasonic treatment of molten metals, in order to achieve a high as possible fineness and homogeneity of the grain size in the cooled, "hardened", condition of the treated material.

There can be achieved in particular for the ultrasonic treatment of fluids an advantageous intensification of the cavitation bubble formation in the material being treated.

The design of the device provides the advantage of a substantially homogenous distribution of the ultrasonic energy radiated into the material being treated.

In the design of the resonator of the inventive device, there is a transport effect along the resonator faults, which leads to the result of a more even or homogenous treatment of the "flowing" material.

By the "eccentric" arrangement of the resonator inner chamber as opposed to the central longitudinal access of its outer jacket surface, there is achieved a directionality effect with respect to the radiated ultrasonic field of such a type, that more ultrasound energy is radiated through the thinner walled area of the resonator jacket than through the thicker walled jacket area. The device following the basic concept of the invention and in certain cases embodiments comprised of multiple hollow chamber resonators, overall longitudinally extending rod shaped ultrasound source has the advantage of its space-saving arrangement of the transducer within the resonator elements and offers also the possibility of radiating particularly high sound capacities into the material being treated. In combination herewith, it is advantageous or useful to employ alternating current controlled transducers as the voltage-sound converter and therein to control or drive the transducers adjacent to each other in the longitudinal direction of the ultrasound source counter-phasic or in phase opposition.

BRIEF DESCRIPTION OF THE DRAWINGS

Further details and characteristics of the invention can be seen from the description of embodiments on the basis of the drawing. There is shown.

DETAILED DESCRIPTION OF THE INVENTION

Figure 1A:
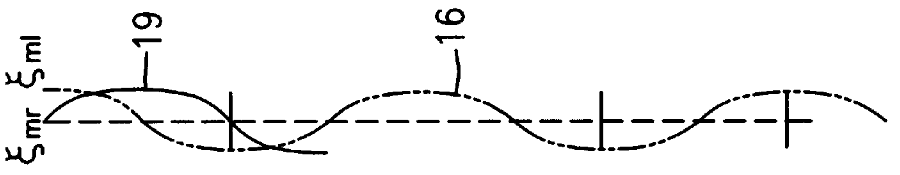
FIG. 1 a first embodiment of the inventive device for introduction of ultrasound into a fluid medium, with a magneto-strictive transducer, which by means of a waveguide system is coupled to a cylindrical-tubular shaped hollow chamber resonator, FIG. 1*a* the amplitude distribution of longitudinal and transverse ultrasound oscillations, to which the transducer and resonator are excitable, FIG. 2 an embodiment of an inventive design with piezo-electric transducers positioned or oriented within hollow chamber resonator elements, FIGS. 3*a*–3*e* special design of hollow chamber resonators, which can be employed in devices according to FIG. 1 and 2, FIG. 4 a resonator with cooling system.
Figure 1:
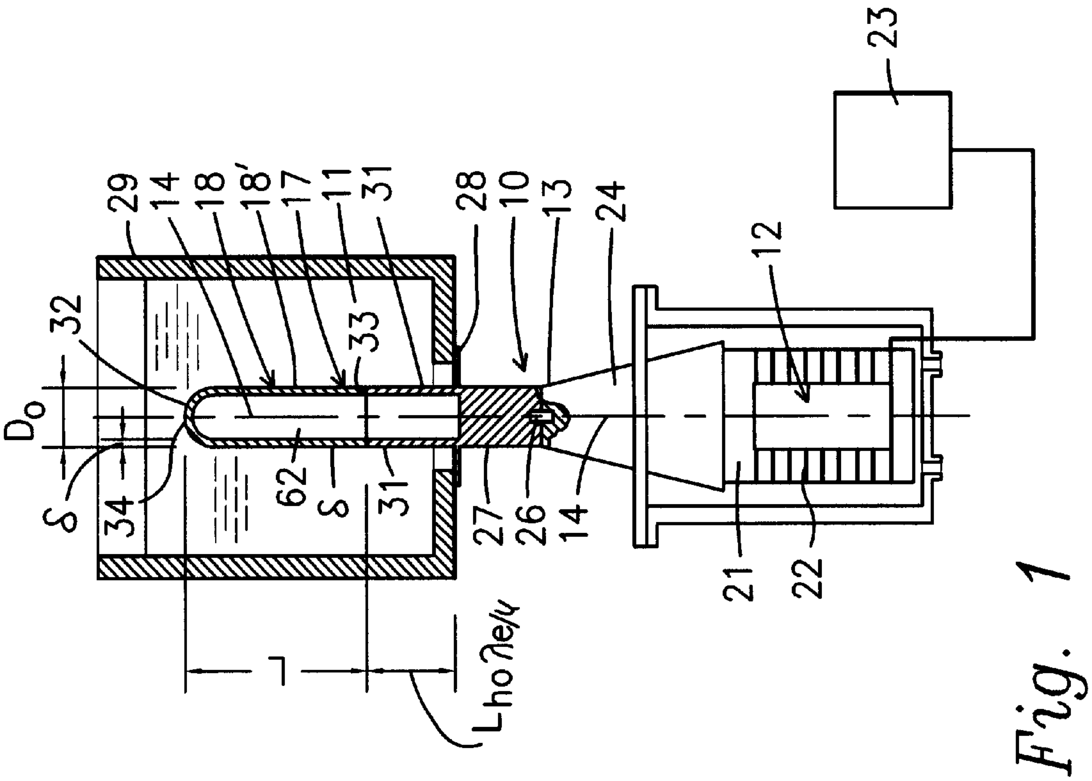

In FIG. 1, reference number 10 refers to an overall device, by means of which ultrasound in the frequency range of 5–50 kHz can be coupled or introduced into a fluid medium 11, which can be a thin fluid or paste or also fluid-like, for example fine particle powder. The device includes a transducer indicated by reference number 12, which converts electrical energy in the form of alternating voltage or as the case may be alternating current into (ultra-)sonic energy, via which the overall with 13 indicated waveguide system is brought to longitudinal oscillations, that is, oscillations of which the deflections occur in the direction of the central longitudinal access 14 of the device 10, of which the amplitude progress or course is given by the . . . indicated distribution curve 16 of FIG. 1A in relation to the geometric measurement or dimensions of the transducer 12, the waveguide system 13 and a thereto acoustically coupled hollow chamber resonator 17, which for its part is excited to longitudinal and transverse ultrasound oscillations by longitudinal oscillations of the waveguide system 13, that is, also to oscillations to the resonator jacket 18 of which the deflections occur radially with respect to the central longitudinal axis 14 of the device 10. The amplitude distribution of this transverse oscillation, to which the hollow chamber resonator 17 is excitable, is shown in the continuous or solid amplitude-distribution curve 19 in FIG. 1A. The hollow chamber resonator 17 is so arranged or designed, that with respect to the longitudinal as well also with respect to the transverse own oscillations of its represented embodiment in essentially, that is in a large part along its length L, cylindric-tubular shaped jacket 18 satisfies the resonator condition.

For the special embodiment shown in FIG. 1, it is preconceived, that the transducer 12 is constructed as a magneto-strictive transducer of already known construction type, of which essentially schematic indicated oscillation body 21 is excited to an ultrasonic oscillation by radiation of its like-wise only schematically indicated field-winding system 22 in the tempo or cycle of the alternating current provided by an alternating current generator 23. The oscillation body 21 of the transducer 12 is in a sense the strong or rigid oscillation-coupling fixedly connected with a truncated cone-shaped concentrator 24 of the waveguide system 13, which for its part, that is, through the screw or thread connection 26 fixedly is coupled with a further, basically cylindrically shaped, like-wise as concentrator acting waveguide 27, with which again the hollow chamber resonator 12 in a sense of a strong acoustic coupling is fixedly connected, whereby this connection can be realized by means of a not-shown threading.

The oscillation body 21 of the transducer, the therewith connected concentrator 24 and the further cylindrical waveguide 27 of the waveguide system 13 as well as the hollow chamber resonator 17 are designed based upon the same mechanical resonator frequency, upon which also the frequency of the alternating current used for radiation of the field development system 22 of the transducer 12 is tuned, which is supplied by the generator 23.

In this tuning, the length of the oscillating body 21 of the transducer 12 measured in the direction of the longitudinal access 14 corresponds to a whole number multiple of the half-wave-length of the longitudinal acoustic oscillations in the magneto-strictive transducer material. In a conventional design of the oscillation body 21 the length corresponds to the half-wave-length of its resident longitudinal own oscillation.

Also, the axial expansion or extension of the truncated cone-shaped represented concentrator 24 corresponds in a conventional manner to the half-wave length of its longitudinal resonant own oscillation which, because of the material dependency of the oscillation frequency, can have another value than the resonator wave-length in the oscillation body 21 of the transducer.

Also, the axial length of the second waveguide 27 or, as the case may be, concentrator of the waveguide system 13 corresponds to the half-resonance-wavelength in the waveguide-material. This second wave-concentrator 27 has, over its entire length, except for a radial outer flange 28 extending only slightly in the axial direction, which is provided for fixing of the waveguide system 13 as well as the hollow chamber resonator 17 on a reactor vessel 29 which contains the fluid medium of 11, the same outer diameter $D_o$, which corresponds also to the outer diameter of the hollow chamber resonator 17.

The second "cylindrical" wave concentrator 27 is formed as a "massive" cylinder on the side facing the first concentrator 24 and on its side facing the hollow chamber resonator 17 is formed pot-shaped, wherein the thickness δ of the second pot material 31 of the second wave concentrator 27 is the same as the thickness of the cylindrical resonator jacket 28. The axial depth of the cylindrical pot jacket 31, which transmits the oscillation concentration to the jacket of the hollow chamber resonator 17, corresponds to a quarter of the resonator wave-length of the longitudinal oscillation in the material of the second wave concentrator 27. In accordance therewith the securing flange 28 is provided in a nodal plane of the longitudinal acoustic oscillations, which via the second wave concentrator 27 are transmitted into the hollow chamber resonator 17, which thereby both for longitudinal as well also as transverse oscillations is resonantly excited, through which action the ultrasonic treatment of the fluid medium 11 results.

The hollow chamber resonator 17 is closed off domed or hemispherically shaped at its end position farthest from the transducer 12, wherein the outer radius $R_c$ of this resonator closure corresponds to the value $D_0/2$ and the thickness δ of this hemispherical shaped resonator closure 32 the thickness δ of the cylinder jacket shaped section 18' of the resonator 18.

In order to achieve optimal geometric dimensioning or measurements of the hollow chamber resonator 17, it is necessary, that this satisfies the resonant condition both for longitudinal as well also for radial oscillation shapes, this under the condition, that the oscillation excitation that occurs by longitudinal acoustic oscillations of the above-mentioned frequency and that also the acoustic resistance of the load of the medium to be treated is adequately taken into consideration.

In accordance therewith, the measured length L of the hollow chamber resonator 17 from the ring shaped end surface 31 of the resonator jacket 18, with which this connects to the cylindrical jacket shaped section 31 of the second wave concentrator 28, and the farthest away point 34 of the hemispherical shaped resonator closure 32 is so selected, that it satisfies the following equation.

$$L = \frac{C_{lR}}{2f_r} n\left(1 - \frac{\Delta L}{1 + \sqrt{1 + \Delta L}}\right); \quad n = 1, 2, 3, \ldots \tag{1}$$

In this equation, $f_r$ represents the "resonance"-frequency, upon which the hollow chamber resonator 17 is to be based. That is generally determined by the frequency of the alternating current generator 23, with which this works at the greatest effectiveness.

$C_{lR}$ represents the sound velocity within the material of which the hollow chamber resonator is comprised.

It is determined by the following equation:

$$C_{lR} = \sqrt{\frac{E(1-v)}{\rho_R(1+\mu)(1-2v)}} \tag{2}$$

In this equation, E represents the Young's Modulus of Elasticity of the resonator material, $\mu$ represents the Poisson's transverse contraction co-efficient of the resonator material and $\rho_r$ represents the thickness of the resonator material.

The outer diameter $D_0$ of the hollow chamber resonator 17 is selected in accordance with the following equation:

$$D_0 = \frac{C_{lr}}{\pi f_r} + (1 + \Delta D) \tag{3}$$

The size ΔL contained in the equation (1) and the size ΔD contained in Equation 3 satisfies the following relationship:

$$\Delta L = \frac{a^2}{a^2 - (1 + \Delta D)^2}; \tag{4}$$

$$\Delta D = \sqrt{\frac{b^2 - a^2}{c^2 - 1}} - 1 \tag{4'}$$

These relationships provide a very good approximation, when at the same time the secondary condition expressed in the following is satisfied:

$$L \leq \frac{\delta(D_0 - \delta) \cdot C_{lR} \cdot \rho_R}{D_0 \rho_L C_L} \tag{5}$$

from which the wall thickness δ of the resonator is produced.

In Equation (5), $C_{lr}$ represents the sound velocity in the resonator material, $C_L$ represents the sound velocity in the "load" medium subjected to ultrasonic treatment and $\rho_L$ represents the thickness of the medium 11 to be treated. The sizes a and b contained in the Equations (4) and (4') are, determined at the same time as step point-coordinates of second functions $a_1(y)$ and $a_2(y)$, that is by finding a solution for:

$$a_1(b) = a_2(b) = a.$$

These functions will in the following for reasons of simplicity simply be characterized with $a_1$ and $a_2$ as functions of the common parameter y. They are implicitly yielded by the following relationships:

$$\xi(a_1, J_n)\beta(a_1) + \mu(a_1, N_n)(1 - G(a_1)) - \mu(y, J_n)G(a_1) + \mu(y, N_n) = 0 \tag{6/1}$$

$$q(a_2, J_n)\beta(a_2) + q(a_2, N_n)(1 - G(a_2)) - \frac{\kappa_t(a_2)}{\kappa l(a_2)}[q(y, J_n)G(a_2) - 9(y, N_n)] = 0 \tag{6/2}$$

$$K_t^2(x) = k_t^2 - k^2(x) \tag{6/3}$$

$$K_l^2(x) = k_l^2 - k^2(x) \tag{6/4}$$

$$k^2(x) = k_t^2 K^2(x) \tag{6/5}$$

$$k_{1,t} = \frac{2\pi f_r}{C_{lR,t}} \tag{6/6}$$

$$\kappa^2(x) = \frac{(1-2v)(b^2 - x^2) - x^2}{(1-2v)(b^2 - x^2)} \tag{6/7}$$

$$\xi(x, Z_n) = z_{N+1}(x) - \frac{v^2 x}{(n+1)(1-v)} Z_n(x) \tag{6/8}$$

$$q(x, Z_n) = \frac{dZ_{n+1}(x)}{dx} - \frac{(n+1)}{x} \cdot Z_{n+1}(x) \tag{6/9}$$

$$\mu(x, Z_n) = Z_{n+1}(x) + \frac{v[\vartheta(x) - \kappa^2(x)]}{(1-v)\kappa^2(x)} \cdot \frac{dZ_{n+1}(x)}{dx} \tag{6/10}$$

with: $\theta(x=a_1 \text{ or } a_2)=1$; $\theta(x=y)=c^2$ $$G(X) = \frac{G_1(x, N_n)}{G_1(x, J_n)} \tag{6/11}$$

$$G_1(x, Z_n) = \mu(x, J_n)[\xi(y, Z_n) + \xi(x, N_n)] - \xi(x, J_n)[\mu(y, Z_n) + \mu(x, N_n)] \tag{6/13}$$

$$C = \frac{C_{lR}}{C_t} \tag{6/14}$$

$$C_t^2 = \frac{E}{2\rho_R(1+v)} \tag{6/15}$$

The two first relationships (6/1) and (6/2) form a transcending equilibrium system for the function $a_1(y)$ and $a_2(y)$ in which $J_n$ represents the known Bessel functions and $N_n$ represents the likewise known Neumann's functions. These functions $J_n$ and $N_n$ have as independent variable respectively those variables $a_1$, $a_2$, or y with which they are associated with the further functions $\mu(x,Z_n)$, $\xi(x,Z_n)$ and $q(x,Z_n)$ . In this relationships "x" represents for the possible variables $a_1$, $a_2$, or y and $Z_n$ represents the respective cylindrical functions namely the Bessel functions $J_n$ or the Neumann's functions $N_n$.

The functions ξ, q and $\mu$ are, with corresponding notation, respectively defined by the relationships (6/8), (6/9), and (6/10), wherein the function θ(x) contained in equation (6/10) is given by the following relationship:

$$\theta(x=a_1 \text{ or } a_2)=1 \text{ and } \theta(x=y)=c^2.$$

For its part C is determined by the relationship (6/14), in which $C_{lR}$ represents the sound velocity of the longitudinal oscillations in the resonator and $C_t$ represents the sound velocity of the transverse ultrasonic oscillations in the resonator. This "transversal" sound velocity satisfies for its part the relationship (6/15), in which $\rho_R$ represents the thickness of the resonator material, E represents the Young's Modulus of Elasticity and v represents the Posson's transverse contraction constant of the resonator material.

The functions β further mentioned in the equations (6/1) and (6/2) of which the variables can once be the function $a_1$ and once the function $a_2$, is indicated in general form by the relationship (6/13). The functions G further contained in the equations (6/1) and (6/2) are given by the relationships (6/11) and (6/12). The function $K^2$ contained in the equation (6/10) are again given in general form by the relationship (6/7) and defined by the relationship (6/3), (6/4), (6/5) and (6/6), wherein the in the relationship (6/6) $C_{1R,t}$ represents on the one hand $C_{1R}$ and on the other hand $C_t$.

Through the relationship (6/6) the wave count $k_1$ and $k_t$ of the longitudinal and transverse oscillations of the resonator at the resonator frequency $f_r$ are given.

The equation system (6/1) and (6/2) can be evaluated in simple manner by variation of the perimeter y.

The further illustrative embodiment of an inventive device for ultrasound treatment of liquid or pasty medium shown in FIG. 2, of which the details will now be made reference to, is analogous in construction and function to that discussed by reference to FIG. 1, so that a discussion can be limited to the differences with respect to the device 10 according to FIG. 1. Insofar as the same reference numbers are employed for elements of the device 10' according to FIG. 2 as occurred in the description of the device 10 of FIG. 1, this is intended to provide an indication of the constructional similarity and also a cross-reference to the description of the device 10 on the basis of FIG. 1.

Figure 2:
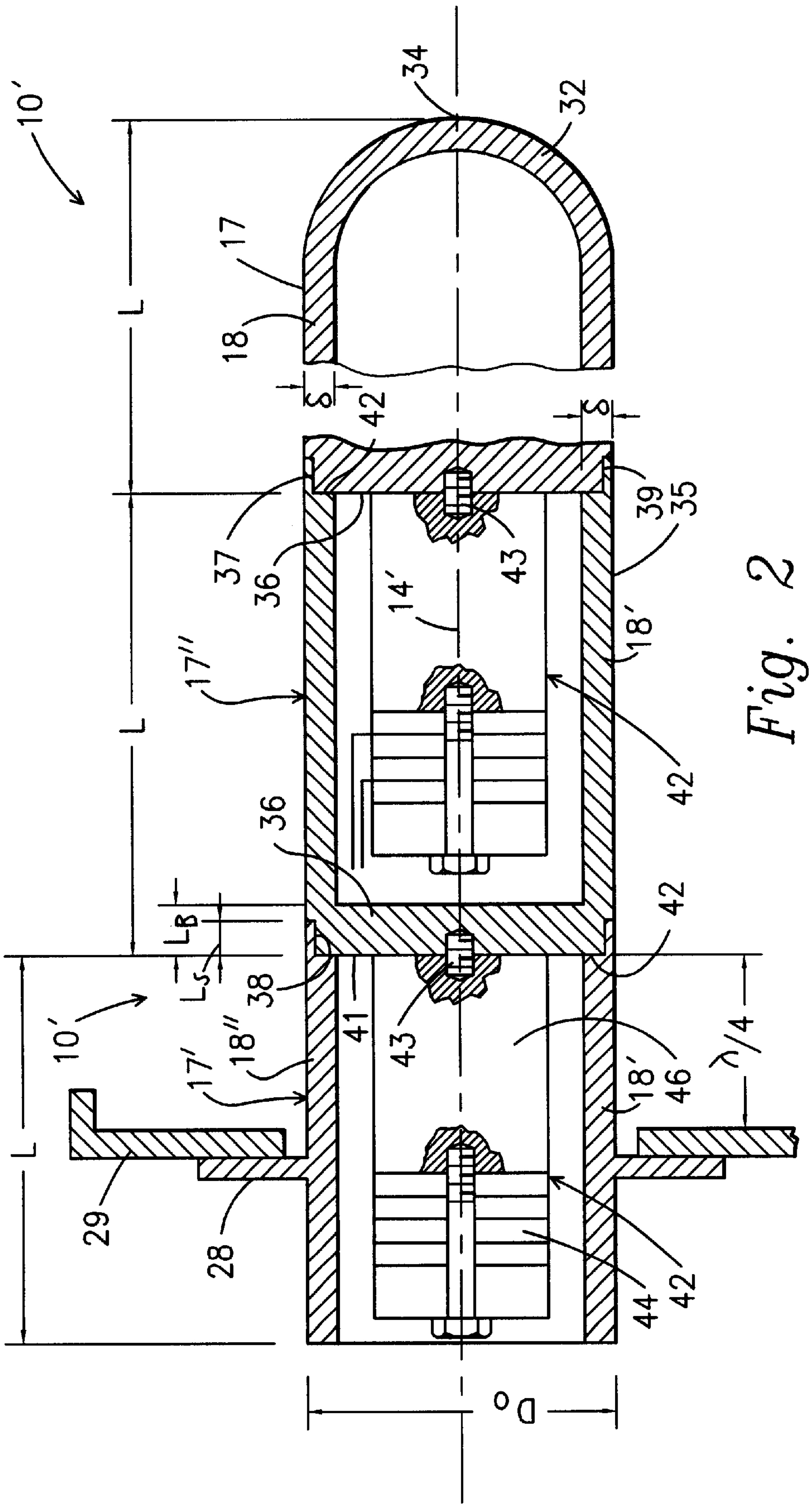

In the device 10' according to FIG. 2 the ultrasound source indicated overall with 35 is comprised of a plurality of hollow chamber resonators, which are arranged along a common central longitudinal axis 14' and fixedly connected with each other. Within an "outer" hollow chamber resonator 17', of which the cylindrical jacket 18' is provided with a assembly flange 28 for outer side securing to a centrally schematically indicated reactor vessel 29, and a "inner" hollow chamber resonator 17, which likewise is provided at the furthest within the reactor vessel in the represented, special embodiment has the same shape as that on the basis of FIG. 1 described hollow chamber resonator 17, are provided multiple identically constructed hollow chamber resonators 17" as intermediate elements, of which for simplification basically only one is represented. These "intermediate" hollow chamber resonators 17" are basically of pot-shaped design with a stable floor 36 of thickness $L_b$ and a tubular shaped cylinder jacket 18'. The various resonators 17, 17' and 17" have the same length L, the same thickness δ of their cylindrical jacket section and the same outer diameter $D_0$, corresponding to the criteria of the on the basis of the embodiment according to FIG. 1 described arrangement criteria, wherein the floor thickness $L_B$ must be selected to be small in comparison to the length L, which suffices as the design criteria with respect thereto (for example: $L_B \leqq L/10$).

The pot shape designed hollow chamber resonators 17" provided between the outer hollow chamber resonator 17' and the hemispherically shaped closed-off hollow chamber resonator 17 are in the area of their floor 36 and in the area of their open end section 37 provided with complimentarily designed outer threading 38 and inner threading 39 of the same axially protrusion $L_s$, which is smaller than the floor thickness $L_B$, by means of which they can be securely screwed together, in such a manner, that the outer floor surface of the one hollow chamber resonator 17" is rigidly supported on an inner ring shoulder 42 of the adjacent hollow chamber resonator 17". The same type of rigid connection is also provided with respect to the outer hollow chamber resonator 17' and the inner, hemispherically shaped closed off hollow resonator chamber 17 with the respective adjacent "intermediate" resonator 17".

In coaxial arrangement with the central longitudinal axis 14" of the ultrasound source 35 there is coupled on the floor 36 of one of each of the intermediate-resonators 17" and overall with 42 indicated ultrasound-transducer. Also the inner hollow chamber resonator 17 of the device 10' is closed off by a floor plate 36, onto which the transducer 42 taken up or received from the adjacent pot shaped hollow chamber resonator 17" is coupled.

In the special embodiment according to FIG. 2, there is essentially to the outer hollow chamber resonator 17' not an equivalent own transducer 42 provided. This on the one side pen tubular shaped designed hollow chamber resonator 17' is likewise or at the same time supplied by the transducer 42, which is rigidly connected to the floor 36 of the adjacent pot shaped resonator 17", for example by means of a schematically indicated threaded connection 43.

As transducer 42 there are employed in the device 10' according to FIG. 2 in suitable manner piezoelectric transducers, which as electromechanical voltage-oscillation converters have an essentially schematically indicated, overall with 44 indicated piezoelectric column, which by driving with an alternating current is excitable to an in the direction of the central longitudinal axis 14' extending "thick" oscillation, that is, longitudinal length changes, which via a transducer block 46, by means of which the transducer 42 is connected or secured to the floor 36 of the respective adjacent hollow chamber resonator 17" or as the case may be 17, upon the respective jacket 18 or as the case may be 18' or as the case may be 18" of the respective hollow chamber resonator 17" or as the case may be 17 or 17' is transmissible, whereby this is excitable to longitudinal and transverse oscillations.

The device 10' is particularly suitable for the ultrasonic treatment of fluid media in reactor vessels 29 which have a relatively large depth and which contain media in correspondingly large "layer"-thickness.

For discussion of a number of variations of resonator designs, which function both in the device 10 according to FIG. 1 as well also in the device 10' according to FIG. 2, references now made to FIGS. 3*a* through 3*e*.

Figure 3A:
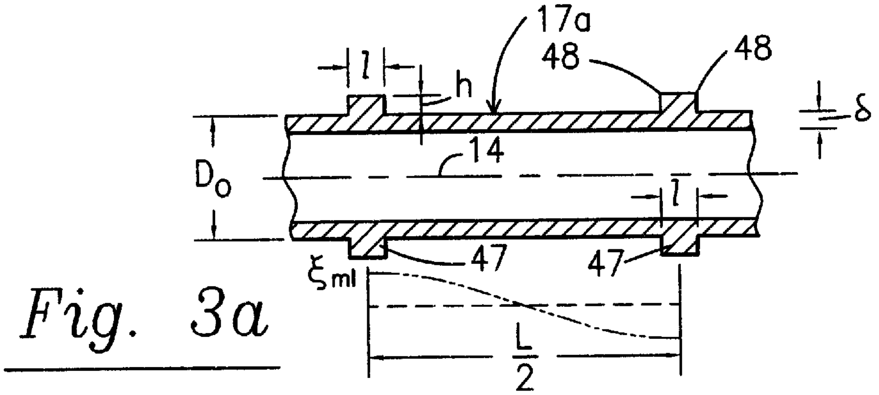

The hollow chamber resonator $\mathbf{17}_a$. according to FIG. 3*a* has the base shape of a cylindrical tube, which over the major part of its length has a constant wall thickness δ, which has an outer diameter $D_0$ and a length L selected according to the relationship (1). In regular intervals, preferably in intervals L/2, wherein L is provided by the relationship (1) for n=1, the hollow chamber resonator $\mathbf{17}_a$ is provided with external, flange shaped ring ribs 47, of which the radial height h and their in the direction of the longitudinal axis measured "axial" thickness 1 respectively is small in comparison to the outer diameter $D_0$ or as the case may be the axial separation L/2 of the ribs 47 to each other. "Small" herein means a fragment or fraction of about 1/10.

By means of these ring ribs 47, which in the longitudinal sectional representation of FIG. 3*a* have a right angle contour with two circular or arch shaped peripheral edges 48, there is produced, particularly in the area of these edges 48, a more intensive cavitation-bubble formation in a fluid to be treated and therewith an improvement of the treatment-effectiveness.

Figure 3B:
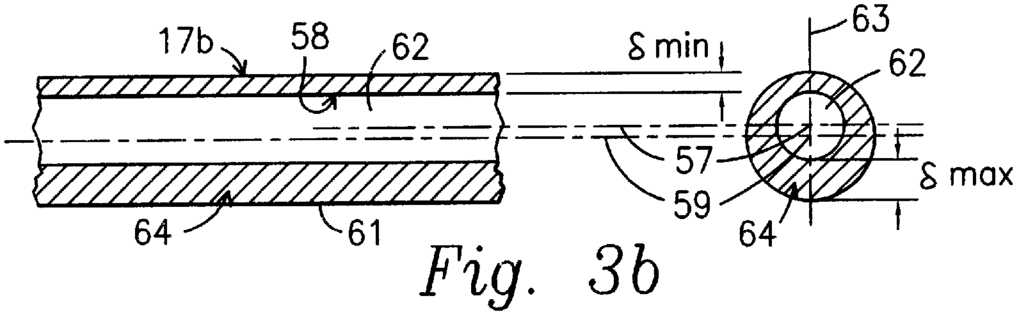
Figure 3C:
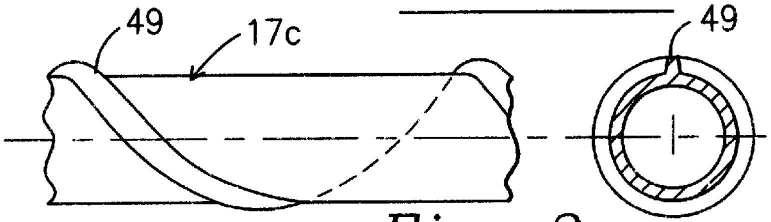
Figure 3D:
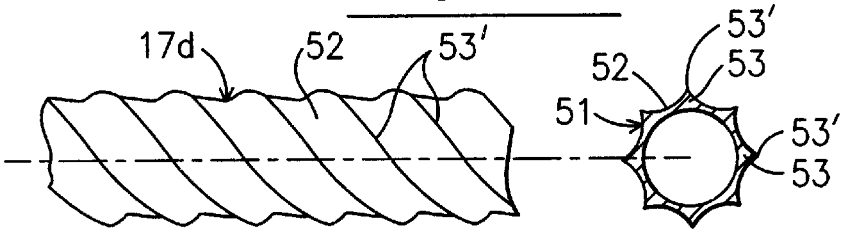

The same applies in the same sense for the hollow chamber resonators $\mathbf{17}_c$ and $\mathbf{17}_d$ according to the FIGS. 3*c* and 3*d* with reference to a spiral shaped running outer rib 49 with for example triangular or trapezoid shaped cross-section (FIG. 3*c*) or for the outer structure of the resonator $17_d$ according to FIG. 3*d* designed or constructed in the manner of a multi-phasic treading, in which a star shaped outer contour 51 of the hollow chamber resonator $17_d$ results viewed in cross-sectional representation, according to the spiral shaped running concave ridges 52 and these against each other setting off, sharp or pointed, radial outer rib edges 53' or ribs 53.

Figure 3E:
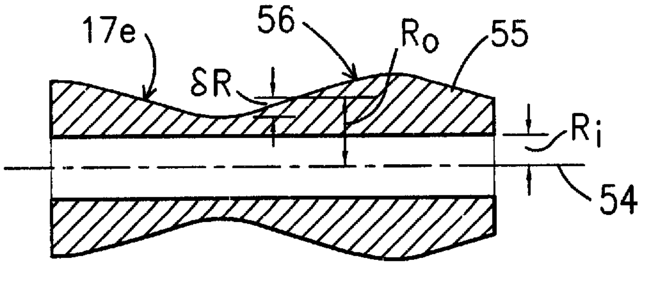

The hollow chamber resonator $17_e$ according to FIG. 3*e* has a resonator form similar to that of resonator $17_a$, of which the inner space has a constant radius $R_i$, in which however the outer radius R(z) is spatially varied according to the relationship $$R(z) = R_0 + \delta R \cdot \sin\left(\frac{z}{z_0}\right) \tag{7}$$

along the central longitudinal axis 54 seen as the z-coordinate.

In this relationship (7) $R_0$ refers to the central radius of the jacket 55 of the hollow chamber resonator $17_e$, $\delta_R$ refers to the amplitude of the radius change and $z_0$ refers to the period length of the spatial radius variations of the resonator-outer surface 56, viewed in the direction of the central z-axes 54. It is understood, that the minimal value of the radius R(z) given by the relationship (7) must be larger than the radius $R_i$ of the inner jacket surface of the hollow chamber resonator $17_e$. In this configuration of the hollow chamber resonator $17_e$ the periodicity of the "wave" structure of the resonator-outer surface 56 can also be significantly smaller than the resonator length L.

In distinction to the variations described on the basis of FIGS. 3*a* and 3*c* through 3*e*, which, other than a spiral shaped structure (FIGS. 3*c* and 3*d*) are axially symmetrical with respect to the respective central longitudinal axis, the hollow chamber resonator $17_b$ according to FIG. 3*b* has a design departing from the cylindrical symmetrical insofar that the central longitudinal axis 57 of its through-going cylindrical bore 58 outer axial with respect to the central longitudinal axis 59 of the outer cylindrical jacket surface 61 is provided, so that the resonator jacket 64 only with respect to one, with the central longitudinal axis 57 of the resonator hollow chamber 62 as well also the central longitudinal axis 59 of its outer jacket surface 61 containing longitudinal plane 63 is formed symmetrically.

In this design of the resonator jacket 64 the thickness thereof varies between a minimal value $\delta_{min}$ and a maximal value $\delta_{max}$. The effect achieved by this design of the resonator jacket 64 is comprised therein, that a directional characteristic of the radiation of the ultrasound waves is achieved, in such a manner, that in the thinner wall areas more ultrasound energy is radiated out than in the thicker wall area. Hollow chamber resonators $17_d$ with this design can be employed advantageously for example in corner areas or edge areas of a large volume reactor vessel.

Figure 4:
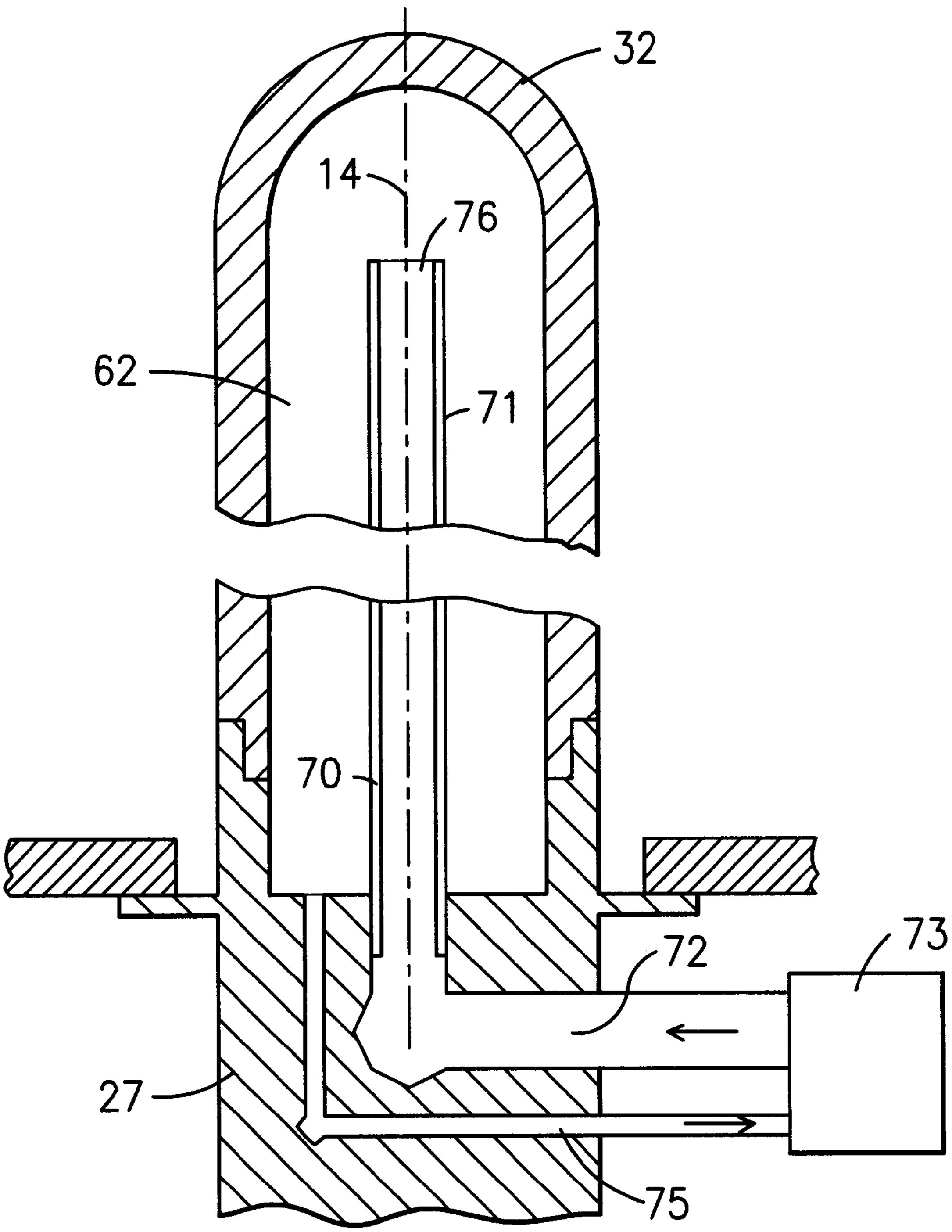

In a special design of a device suitable for the treatment of molten metal according to FIG. 1 with "through going", unitized resonator-hollow chamber 62 this is provided with a, in FIG. 4 schematically simplified representation, cooling system 70, by means of which the resonator hollow chamber 62 is flushed with cooling liquid. Hereby there is in the entire volume of the material to be treated, which finally is cooled to the point of solidification, a substantially finer and more homogenous distribution of grain size achieved, since because of the cooling a micro-crystal formation occurs first in the immediate vicinity of the resonator, these primary micro-crystals however again diffusing from here into the warmer areas, which finally achieves the homogenous distribution of the particle size in the material.

This cooling system 70 includes a, with respect to the central longitudinal axis 14 of the hollow chamber resonator 17, coaxial introduction tube 71, which via a supply conduit 72 of the wave guide 27 is connectable to a cooling material source 73, and a likewise on the wave guide 27 provided outlet conduit 75, via which cooling medium can flow out of the resonator hollow chamber 62 back to the cooling medium source.

The connection opening 76 of the supply conduit 71, via which the cooling medium flows into the resonator hollow chamber 62, is provided in immediate vicinity of the hemi-spherical shell shaped resonator closure 32.

What is claimed is:

1. Device for transmitting ultrasoninc energy to a fluid or pasty medium, with a) an alternating current generator, which is designed to provide frequencies between 1 kHz and 100 kHz, b) a magnetostrictive or piezoelectric transducer which can be brought into high frequency longitudinal mechanical oscillations under the alternating current voltage output of a generator, c) a cylindrical-rod shaped wave guide, which can be excited to longitudinal resonant oscillations via the transducer, and d) a tubular shaped hollow chamber resonator acoustically coupled with the wave guide, which converts the longitudinal resonant oscillations in respect to its longitudinal axis into transverse oscillations, of which the oscillation energy can be transmitted into the medium to be treated with ultrasound, whereby e) the hollow chamber resonator is so arranged or designed, that it satisfies the resonance condition with respect to the longitudinal as well also with respect to the transversal self-oscillations of its jacket, wherein the resonator length L, the outer diameter $D_0$ and the thickness δ of the resonator wall (18; 62) are tuned to each other according to the relationships $$L = \frac{C_{lR}}{2f_r} n\left(1 - \frac{\Delta L}{1 + \sqrt{1 + \Delta L}}\right); n = 1, 2, 3, \ldots \tag{1}$$

$$D_0 = \frac{C_{lr}}{\pi f_r} + (1 + \Delta D) \tag{3}$$

$$L \leq \frac{\delta(D_0 - \delta) \cdot C_{lR} \cdot \rho_R}{D_0 \rho_L C_L} \tag{5}$$

in which $C_{lR}$ represents the sound velocity of the longitudinal ultrasound-oscillations in the material of the hollow chamber resonator (17; 17'), which is satisfied by the relationship $$C_{lR} = \sqrt{\frac{E(1 - \nu)}{\rho_R (1 + \nu)(1 - 2\nu)}} \tag{2}$$

wherein $C_L$ represents the sound velocity in the ultrasound radiation subjected load material, $\rho_R$ represents the specific weight of the resonator material, $\rho_L$ represents the specific weight of the load material, E represents the Young's modulus of elasticity, with the Poisson's transverse contraction constant of the resonator-material, and $f_r$ represents the resonance frequency of the hollow chamber-resonator (17; 17'), wherein the dimensions $\Delta L$ and $\Delta D$ satisfy the relationships $$\Delta L = \frac{a^2}{a^2 - (1 + \Delta D)^2} \tag{4}$$

and $$\Delta D = \sqrt{\frac{b^2 - a^2}{c^2 - 1}} - 1 \tag{4'}$$

in which a and b characterize the point of intersection coordinates of two functions $a_1(y)$ and $a_2(y)$ according to the relationship $a_1(b)=a_2(b)=a$, which in implicit form are provided by the relationships $$\xi(a_1,J_n)\beta(a_1)+\mu(a_1,N_n)(1-G(a_{1))-\mu}(y,J_n)G(a_1)+\mu(y,N_n)=0 \tag{6/1}$$

$$q(a_2, J_n)\beta(a_2) + q(a_2, N_n)(1 - G(a_2)) - \frac{\kappa_t(a_2)}{\kappa_t(a_2)}[q(y, J_n)G(a_2) - 1(y, N_n)] = 0 \tag{6/2}$$

$$\kappa_t^{\,2}(x)=k_t^{\,2}-k^2(x) \tag{6/3}$$

$$\kappa_l^{\,2}(x)=k_l^{\,2}-k^2(x) \tag{6/4}$$

$$k^2(x)=k_l^{\,2}\kappa^2(x) \tag{6/5}$$

$$k_{1,t} = \frac{2\pi f_r}{C_{lR,t}} \tag{6/6}$$

$$\kappa^2(x) = \frac{(1 - 2\nu)(b^2 - x^2) - x^2}{(1 - 2\nu)(b^2 - x^2)} \tag{6/7}$$

$$\xi(x, Z_n) = z_{N+1}(x) - \frac{\nu^2 x}{(n + 1)(1 - \nu)} Z_n(x) \tag{6/8}$$

$$q(x, Z_n) = \frac{dZ_{n+1}(x)}{dx} - \frac{(n + 1)}{x} \cdot Z_{n+1}(x) \tag{6/9}$$

$$\mu(x, Z_n) = Z_{n+1}(x) + \frac{\nu[\vartheta(x) - \kappa^2(x)]}{(1 - \nu)\kappa^2(x)} \cdot \frac{dZ_{n+1}(x)}{dx} \tag{6/10}$$

with: $\theta(x=a_1 \text{ or } a_2)=1$; $\theta(x=y)=c^2$ $$G(X) = \frac{G_1(x, N_n)}{G_1(x, J_n)} \tag{6/11}$$

$$G_1(x,Z_n)=\mu(x,J_n)[\xi(y,Z_n)+\xi(x,N_n)]-\xi(x,J_n)[\mu(x,Z_n)+\mu(x,N_n)] \tag{6/13}$$

$$C = \frac{C_{lR}}{C_t} \tag{6/14}$$

$$C_t^2 = \frac{E}{2\rho_R(1 + \nu)} \tag{6/15}$$

are given, wherein $C_t$ represents the sound velocity of the transverse ultrasound wave.

2. Device according to claim 1, wherein the hollow chamber resonator (17) over its entire length, or over at least a major portion of its length, has the shape of an inner and outer cylindrical tube, which on its end distant from the transducer is preferably provided with a hemispherical (32) shaped closure.

3. Device according to claim 2, wherein the inner chamber of the hollow resonator (17) can be flushed with a liquid cooling medium.

4. Device according to claim 1, wherein the supply of the cooling means to the hollow chamber of the resonator occurs via a central tube coaxial to the longitudinal axis (14), of which the opening is provided in the vicinity of the resonator closure (32), and the return of the cooling medium occurs via a return flow conduit provided in the wave guide block of the transducer.

5. Device according to claim 1, wherein the resonator (17*a*; 17*e*) is provided on its outer side with ring ribs (47), at least in the areas of high deflection amplitudes in the longitudinal oscillation direction.

6. Device according to claim 5, wherein the ring ribs (47) have the form of radial flanges with acute angled peripheral edges (48), wherein the radial projection h of these ring ribs is small in comparison to the outer diameter $D_0$ of the ring shaped base body of the resonator (17$_a$) and the axial thickness l of these ribs is small in comparison to the value L/2 (for n=1).

7. Device according to claim 5, wherein the outer radius R(z) of the hollow chamber resonator (17*e*) is calculated according to the relationship $$R(z) = R_0 + \delta R \cdot \sin\left(\frac{z}{z_0}\right)$$

in which $R_0$ represents the central radius of the resonator jacket (55), $\delta R$ represents the amplitude of the radius change and $z_0$ represents the periodic length of the radius variation, seen in the direction of the central resonator longitudinal axis (54).

8. Device according claim 1, wherein the resonator (17*c*; 17*d*) has at least a spiral or helical shaped outer rib (49; 53), of which the radial outer projections are small in comparison to the outer diameter $D_0$.

9. Device according to claim 8, wherein the manner of a multi-threaded winding multiple spiral shaped running outer ribs (53) are provided on the resonator jacket.

10. Device according to claim 1, wherein the central longitudinal axis (57) of the cylindrical inner chamber (58) of the hollow resonator (17*b*) is provided abaxialy with respect to the central longitudinal axis (59) of its radial outer cylindrical jacket surface (61) or the cylindrical whole surface of its outer structure (47; 49; 52, 53; 56).

11. Device according to claim 1, wherein at least three hollow chamber resonators (17, 17" and 17') of the same length L, the same outer diameter $D_0$ and the same resonance frequency $F_r$ are united into an overall rod-shaped ultrasound source (35) in coaxial arrangement along a common central longitudinal axis with rigid acoustic coupling, within which respectively in the internal chamber of the resonator elements (17', 17") transducers (42) are provided, which are coupled via a wave guides (46) respectively onto an adjacent resonator hollow chamber against a transverse wall (36 ) which via the resonators (17, 17", 17') overall forms the ultrasound source (35).

12. Device according to claim 11, wherein the transducers (42 ) have alternating current controlled piezoceramic alternating current-sound transformers.

13. Device according to claim 12, wherein in the longitudinal direction (42) of the ultrasound source (35) the transducers adjacent to each other are controllable counter phasically.

14. Device according to claim 1, wherein between an outer resonator element (17') and the inner resonator element (17) distanced therefrom is/are provided resonator element (s) (17") pot-shaped in form, with tubular shaped cylindrical jackets (18') and a stable floor (36), onto which the transducer (42) of the adjacent resonator element (17") is coupled, wherein the floor thickness $L_B$ is small in comparison to the axial projection of the respective resonator elements (17', 17").

15. Device according to claim 11 wherein the pot-shaped formed hollow chamber resonator(s) (17") in the area of their floor (36) and in the area of their open end section (36) are provided with an outer threading (38) and a thereby complimentary inner threading of the same axial projection $L_S$ for securing with respective adjacent resonator element (17, 17" and 17 [sic]) wherein the axial separation $L_S$ of this threading (38, 39) is significantly smaller than the floor thickness $L_B$ of the pot shaped designed resonator elements (17").

* * * * *